US006593795B2

(12) United States Patent
Cho

(10) Patent No.: US 6,593,795 B2
(45) Date of Patent: Jul. 15, 2003

(54) LEVEL ADJUSTMENT CIRCUIT AND DATA OUTPUT CIRCUIT THEREOF

(75) Inventor: Shizuo Cho, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/059,151

(22) Filed: Jan. 31, 2002

(65) Prior Publication Data

US 2002/0149392 A1 Oct. 17, 2002

Related U.S. Application Data

(63) Continuation of application No. 09/531,669, filed on Mar. 20, 2000, now Pat. No. 6,459,322.

(30) Foreign Application Priority Data

Nov. 18, 1999 (JP) ............................................. 11-327834

(51) Int. Cl.[7] ................................................. H03L 5/00
(52) U.S. Cl. ........................ 327/333; 327/319; 327/321
(58) Field of Search ................................ 327/306, 315, 327/319, 321, 331, 333, 112; 326/62, 63, 68, 80, 81, 85

(56) References Cited

U.S. PATENT DOCUMENTS

| | | | |
|---|---|---|---|
| 4,978,870 A | | 12/1990 | Chen et al. ..................... 326/68 |
| 5,748,024 A | * | 5/1998 | Takahashi et al. ........... 327/333 |
| 5,905,402 A | * | 5/1999 | Kim et al. ................... 327/333 |
| 5,969,554 A | * | 10/1999 | Chan et al. .................. 327/170 |
| 6,177,824 B1 | * | 1/2001 | Amanai ....................... 327/333 |
| 6,262,599 B1 | * | 7/2001 | Coughlin et al. .............. 326/81 |

FOREIGN PATENT DOCUMENTS

| | | |
|---|---|---|
| EP | 0926830 A2 | 12/1998 |
| WO | WO98/15060 | 4/1998 |

* cited by examiner

*Primary Examiner*—Matthew Smith
*Assistant Examiner*—Paul Dinh
(74) *Attorney, Agent, or Firm*—Rabin & Berdo,P.C.

(57) ABSTRACT

A level adjustment circuit of the present invention includes a MOS transistor for pulling up an output node, a first inverter for inputting an output data signal and outputting a gate control signal for controlling a gate electrode of the MOS transistor, and a second inverter connected to the MOS transistor between the first and second electrodes for inputting the first node obtained based on the output data signal, and outputting the output node.

20 Claims, 4 Drawing Sheets

LEVEL ADJUSTMENT CIRCUIT AND DATA OUTPUT CIRCUIT THEREOF

CROSS-REFERENCE TO RELATED APPLICATIONS

This is a continuation of applicant's application Ser. No. 09/531,669, filed Mar. 20, 2000, now U.S. Pat. No. 6,459,322.

BACKGROUND OF THE INVENTION

1. Field of the Invention

The present invention relates to a semiconductor integrated circuit, and more particularly to a level adjustment circuit including a circuit operated by an inside power source voltage (VDD) and a data output circuit thereof.

2. Description of Related Art

A level adjustment circuit for converting logic amplitude from an inside power source voltage (VDD) level to an outside power source voltage (VCC) level includes two NMOS transistors and two PMOS transistors connected to VCC and ground power source voltage. Each source electrode of the PMOS transistors is connected to VCC. Further, a gate electrode and a drain electrode are connected in a cross-coupling way with each other, and each of them is connected to the output node. An output level of this type of conventional level adjustment circuit is determined by the ON resistance ratio of the PMOS transistor and the NMOS transistor.

However, according to the conventional circuit, there is a problem in which a time interval is long between time at which a logic level of data and the output control signal changes, and time at which a logic level of an output and level adjustment circuit changes, thus it is desired to improve the speed.

SUMMARY OF THE INVENTION

The object of the present invention is to provide a level adjustment circuit to shorten the time interval between the time at which a logic level of an output control signal of data changes and the time at which the logic level of an output of the level adjustment circuit changes. A level adjustment circuit of the present invention includes a MOS transistor for pulling up an output node, a first inverter for inputting output data signal and outputting a gate control signal for controlling a gate electrode of the MOS transistor, and a second inverter connected to the MOS transistor in series between first and second power sources for inputting a first node obtained based on the output data signal, and outputting the output node. The data output circuit of the present invention includes a first inverter connected to the first and second power sources for inputting output data signal and outputting to a first node, and a level adjustment circuit connected to the second power source and a third power source, electric potential of which is higher than the first power source, for outputting to a second node, in which the level adjustment circuit has a first MOS transistor for pulling up the second node, and a second inverter connected to the first MOS transistor in series between the second and third power sources; and a third inverter for inputting the data signal and outputting a gate control signal for controlling a gate electrode of the first MOS transistor.

BRIEF DESCRIPTION OF THE DRAWINGS

While the specification concludes with claims claiming the subject matter regarded as the invention, the invention will be better understood based on the following description and the accompanying drawings related to this:

DESCRIPTION OF THE PREFERRED EMBODIMENT

The First Preferred Embodiment

Figure 1:
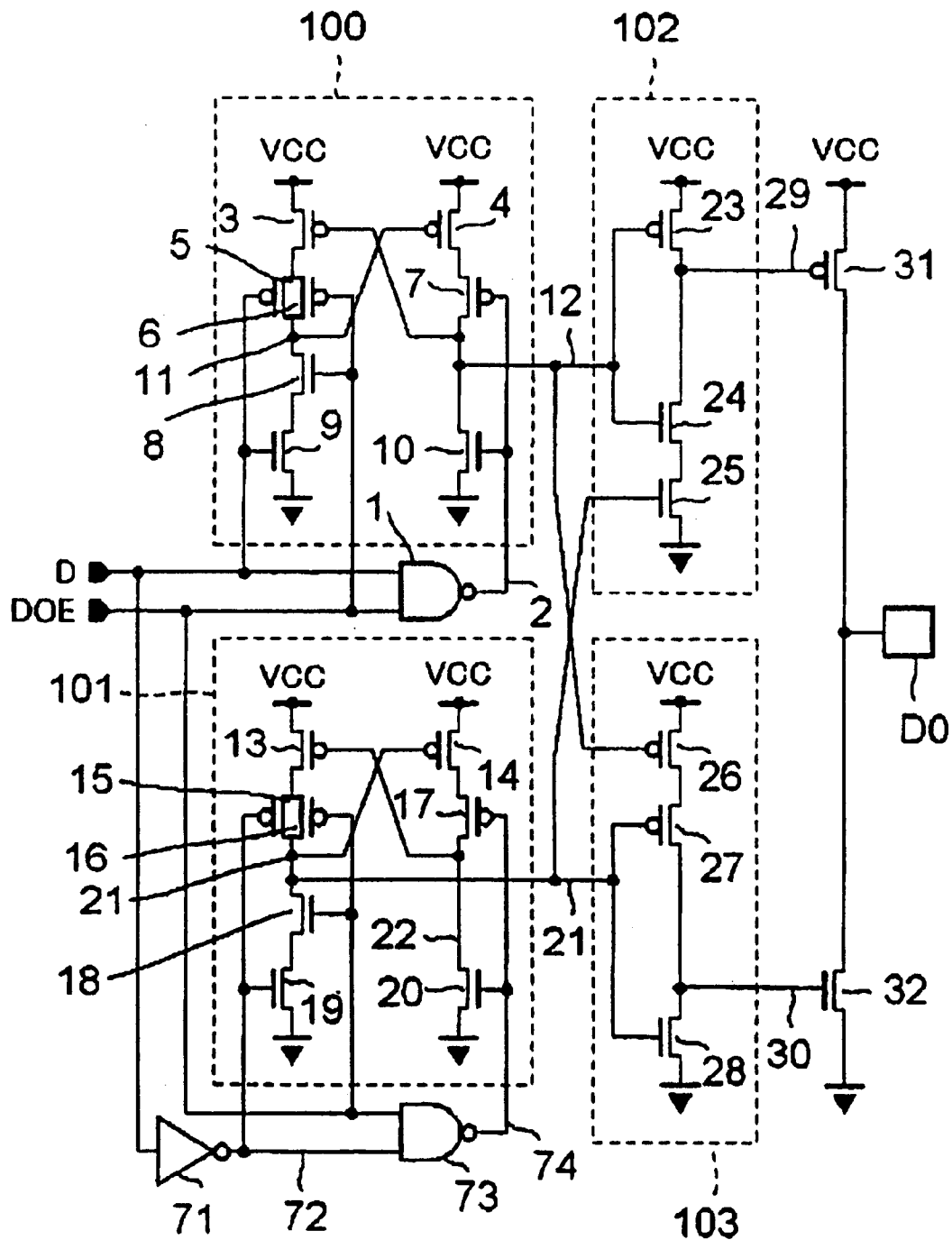
FIG. 1 is a circuit diagram of the first and second preferred embodiments of the present invention.

FIG. 1 is a diagram of a circuit of the first and second preferred embodiments of the present invention. A level adjustment circuit 100 includes PMOS transistors 3 to 7 and NMOS transistors 8 to 10. A source electrode, a gate electrode, and a drain electrode of a PMOS transistor 3 are connected to VCC, an output node 12, and a common source electrode of PMOS transistors 5 and 6 respectively. Drain electrodes of the PMOS transistors 5 and 6 are connected to the output node 11 and each of gate electrodes thereof are connected to each of an output data signal D and an output control signal (enable signal) DOE respectively. A source electrode, a gate electrode, and a drain electrode of a PMOS transistor 4 are connected to VCC, the output node 11, and a source electrode of the PMOS transistor 7 respectively. A drain electrode of the PMOS transistor 7 is connected to an output node 12, and a gate electrode thereof is connected to an output 2 of NAND 1, input electrodes of which are the output data signal D and the output control signal DOE. NAND 1 uses VDD and GND as power sources.

A drain electrode, a gate electrode, and a source electrode of the NMOS transistor 8 are connected to the output node 11, the output control signal DOE, and a drain electrode of the NMOS transistor 9 respectively. A gate electrode of the NMOS transistor 9 is connected to the output data signal D and a source electrode thereof is connected to GND. A drain electrode, a gate electrode, and a source electrode of the NMOS transistor 10 are connected to the output node 12, the output node 2 of NAND 1, and GND respectively. Here, when voltage difference between a VCC level and a VDD level is more than a threshold value, the PMOS transistors 5 to 7 function as resistors. The resistance value thereof changes to a maximum when the gate voltage of the PMOS transistors 5 to 7 is at the VDD level. On the contrary, the resistance value thereof changes to a minimum when the gate voltage of the PMOS transistors 5 to 7 is at a ground level.

A level adjustment circuit 101 includes PMOS transistors 13 to 17 and NMOS transistors 18 to 20. A source electrode, a gate electrode, and a drain electrode of PMOS transistors 13 are connected to VCC, an output node 22, and a common source bus of PMOS transistors 15 and 16 respectively. The drain electrodes of PMOS transistors 15 and 16 are connected together with an output node 21, and each of gate electrodes thereof is connected to either an output signal 72 of an inverter 71 to which an output data signal D is input or an output control signal (enable signal) DOE respectively. A source electrode, a gate electrode, and a drain electrode of a PMOS transistor 14 are connected to VCC, the output node 21, and a source electrode of the PMOS transistor 17 respectively. A drain electrode of the PMOS transistor 17 is connected to the output node 22, and a gate electrode thereof is connected to the output signal 72 of the inverter 71 and an output node 74 of NAND 73 to which the output signal 72 of the inverter 71 and the output control signal DOE are input.

A drain electrode, a gate electrode, and a source electrode of the NMOS transistor 18 are connected to the output node 21, the output control signal DOE, and a drain electrode of the NMOS transistor 19 respectively. A gate electrode of the NMOS transistor 19 is connected to the output signal 72 of the inverter 71 and a source electrode thereof is connected to GND. A drain electrode, a gate electrode, and a source electrode of the NMOS transistor 20 are connected to the output node 22, the output node 74 of the NAND 73, and GND respectively. Further, the PMOS transistors 15 to 17 function as the resistances in the same way as the PMOS transistors 5 to 7. Similar to the conventional technology, NAND and the inverter use VDD and GND as the power sources. A logic amplitude of the output, the output signal D, and the output control signal DOE of NAND and the inverter, are at the VDD level.

Figure 2:
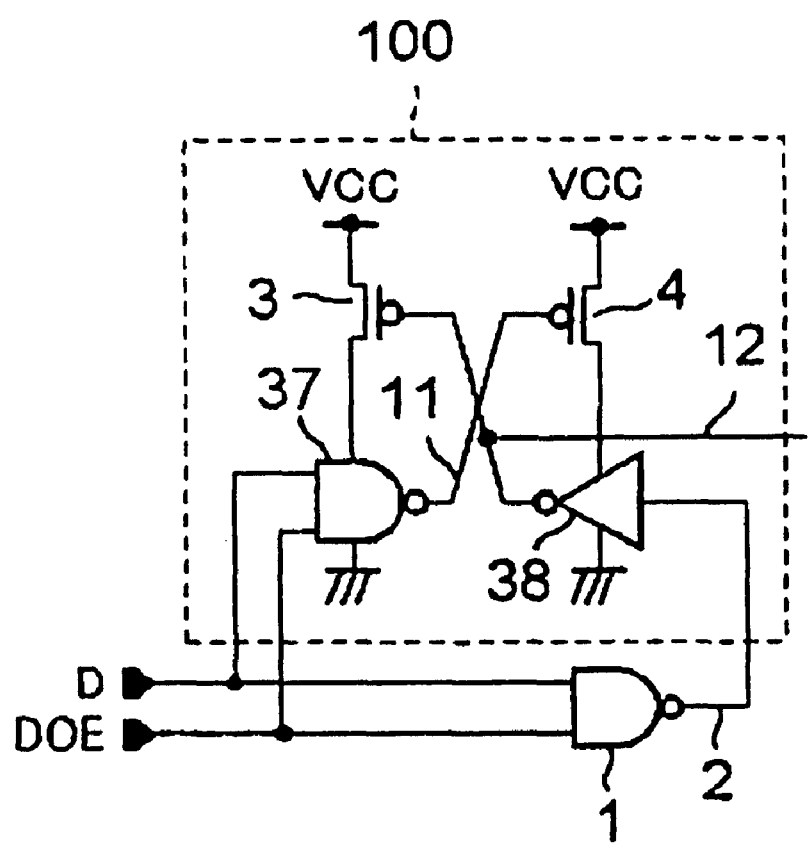
FIG. 2 is a circuit diagram of an equalizing circuit of a level adjustment circuit of the present invention.

FIG. 2 is an equivalent circuit to the level adjustment circuit of FIG. 1. The level adjustment circuit 100 is explained as an example, and the same reference numbers in the two figures are used for the same components. The level adjustment circuit 100 includes a NAND 37, to which the output data signal D and the output control signal (enable signal) DOE are input. The output node 11 is output using VCC and GND as the power sources, and an inverter 38 for receiving an input from the output node 2 and outputting to the output node 12. The PMOS transistor 3 is a pull-up transistor for pulling-up the output node 12, and the gate electrode is controlled by the output node 11. NAND 1 uses VDD and GND as power sources.

The function of the level adjustment circuit of the preferred embodiment is explained using the level adjustment circuit 100 as an example. When the output control signal DOE is at level L, since the output node 2 of NAND 1 changes to level H unrelated to the output data signal D, the NMOS transistor 10 changes to an ON state. At this time, since the resistance value of the PMOS transistor changes to the maximum, the output node 12 is pulled down quickly and the PMOS transistor 3 changes to an ON state. On the other hand, the NMOS transistor 8 changes to an OFF state. Since the resistance value by the PMOS transistor 6 changes to the minimum, the output node 11 is raised to the level H for about the same time as the conventional embodiment and the PMOS transistor 6 changes to the OFF state.

It is explained, as an example, that the output control signal DOE changes to the level H and the output data signal D changes from the level L to the level H. When the output data signal D changes from the level L to the level H, the output node 2 of NAND 1 changes from the level H to the level L. Also at this time, the resistance value of the PMOS transistor 3 changes from the maximum to the minimum, and the NMOS transistor 10 changes from the ON state to the OFF state. On the other hand, the resistance value of the PMOS transistor 5 changes from the minimum to the maximum, and the NMOS transistor 9 changes from the OFF state to the ON state. As a result, the output node 11 is quickly pulled down from the level H to the level L, and since the PMOS transistor 4 changes to the ON state, the output node 12 is rapidly pulled up from the level L to the level H.

It is explained, as an example, that the output control signal DOE changes to the level H and the output data signal D changes from the level H to the level L. When the output data signal D changes from the level H to the level L, the output node 2 of the NAND 1 changes from the level L to the level H. At this time, the resistance value of the PMOS transistor 7 changes from the minimum to the maximum, and the NMOS transistor 10 changes from the OFF state to the ON state. Since the output data signal D maintains the level H, the PMOS transistor 4 remains in the ON state. Since the PMOS transistor 7 functions as the resistor, the output node 12 is pulled down rapidly from the level H to the level L, and the PMOS transistor 3 changes to the ON state. On the other hand, the resistance value of the PMOS transistor 5 changes from the maximum to the minimum, and the NMOS transistor 9 changes from the ON state to the OFF state. As a result, the output node 11 is rapidly raised to the level H from the level L, and the PMOS transistor 4 changes to the OFF state. An explanation of the functioning of the level adjustment circuit 101 is omitted, but it is easy to comprehend the functioning based on the operation of the level adjustment circuit 100.

As shown in the above, the level adjustment circuit of the first preferred embodiment provides the MOS transistor, in which the resistance value changes corresponding to an electric potential level applied to the gate electrode, for raising the output node. The gate electrode is between the output node and the drain electrode of the PMOS transistor. Compared with the conventional method, the time required to change the logic level of the output of the level adjustment circuit is reduced.

Further, since the number of switching actions from the output data signal D to the output of the level adjustment circuit is lessened, the time required to output the changed logic level is reduced. The number of switching actions of the level adjustment circuit of the preferred embodiment is half as many as the conventional circuits.

The Second Preferred Embodiment.

The preferred embodiment relates to the data output circuit including the level adjustment circuits 100 and 101. An inverter 102 uses VCC and GRD as power sources, and also includes a PMOS transistor 23 and NMOS transistors 24 and 25. Gate electrodes of the PMOS transistor 23 and the NMOS transistor 24 are connected to the output node 12 of the level adjustment circuit 100. A gate electrode of the NMOS transistor 25 is connected to the output node 21 of the level adjustment circuit 101, which node has a reversed polarity to the output node 12. The output node 29 of the inverter 102 is connected to a gate electrode of the PMOS transistor 31, which is the pull-up transistor for an output terminal DO.

The inverter 103 uses VCC and GND as power sources, and also includes PMOS transistors 26 and 27 and an NMOS transistor 28. Gate electrodes of the PMOS transistor 27 and the NMOS transistor 28 are connected to the output node 21 of the level adjustment circuit 101. A gate electrode of the PMOS transistor 26 is connected to an output node 12 of the level adjustment circuit 100, which has a reversed polarity to the output node 21. The output node 30 of the inverter 103 is connected to a gate electrode of an NMOS transistor 32 that is a pull-down transistor of the output terminal DO.

The function of the data output circuit is explained using a case where the output nodes 29 and 30 of the inverters 102 and 103 change to the level H from the level L at the same time. When the output node 12 of the level adjustment circuit 100 is the level L, the PMOS transistor 23 changes to the ON state and the NMOS transistor 24 changes to the OFF state. Therefore, an output node 29 changes to the level H and the PMOS transistor 31 changes to the OFF state whilst being completely unrelated to the ON or OFF state of the NMOS transistor 25. Further, when the output node 21 of the inverter 103 is at the level L, the PMOS transistors 26 and 27 change to the ON states and the NMOS transistor 28 changes to the OFF state. Therefore, the output node 30 of the inverter 103 changes to the level H, and the NMOS transistor 32 changes to the ON state. At this time, the output terminal DO is at the level L.

When the output node 21 of the level adjustment circuit 101 changes to the level H from the level L with a delay time t to the output node of the level adjustment circuit 100, the PMOS transistors 23 and 26 initially change to the OFF state and the NMOS transistor 24 changes to the ON state. Following this, the PMOS transistor 27 changes to the OFF state with the delay time t, and the NMOS transistors 25 and 28 change to the ON state. As a result, since the output nodes 12 and 21 change to the level L from the level H, the PMOS transistor 31 changes to the ON state from the OFF state and the NMOS transistor 32 changes to the OFF state from the ON state in that order. The output node 29, in the inverter 102, is discharged through an ON resistance of the NMOS transistors 24 and 25 connected in series. Thus, the changing time of the logic level of the output node 29 is delayed compared with a changing time of the logic level of the output node 30 of the inverter 103. That is to say, the output terminal DO changes to the level H from the level L when the PMOS transistor 31 is in the ON state after the NMOS transistor 32 changes to the OFF state.

Explanation of the function by which the output nodes 29 and 30 change to the level L from the level H at the same time is omitted, since it is readily understood from embodiment described above. In that case, the output node 30 in the inverter 103, is charged through the ON resistance of the PMOS transistors 26 and 27 connected in series. Thus, the time required for changing the logic level of the output node 30 is delayed compared with the logic level changing time of the output node 29 of the inverter 102. In other words, the output terminal DO changes to the level L from the level H when the PMOS transistor 31 changes to the ON state after the PMOS transistor 31 changes to the OFF state.

As shown above, according to the second preferred embodiment, the pull-up transistor (PMOS transistor 31) and the pull-down transistor (NMOS transistor 32) change to the ON state at the same time, and excess current flowing from VCC to GND may be avoided.

The Third Preferred Embodiment

Figure 3:
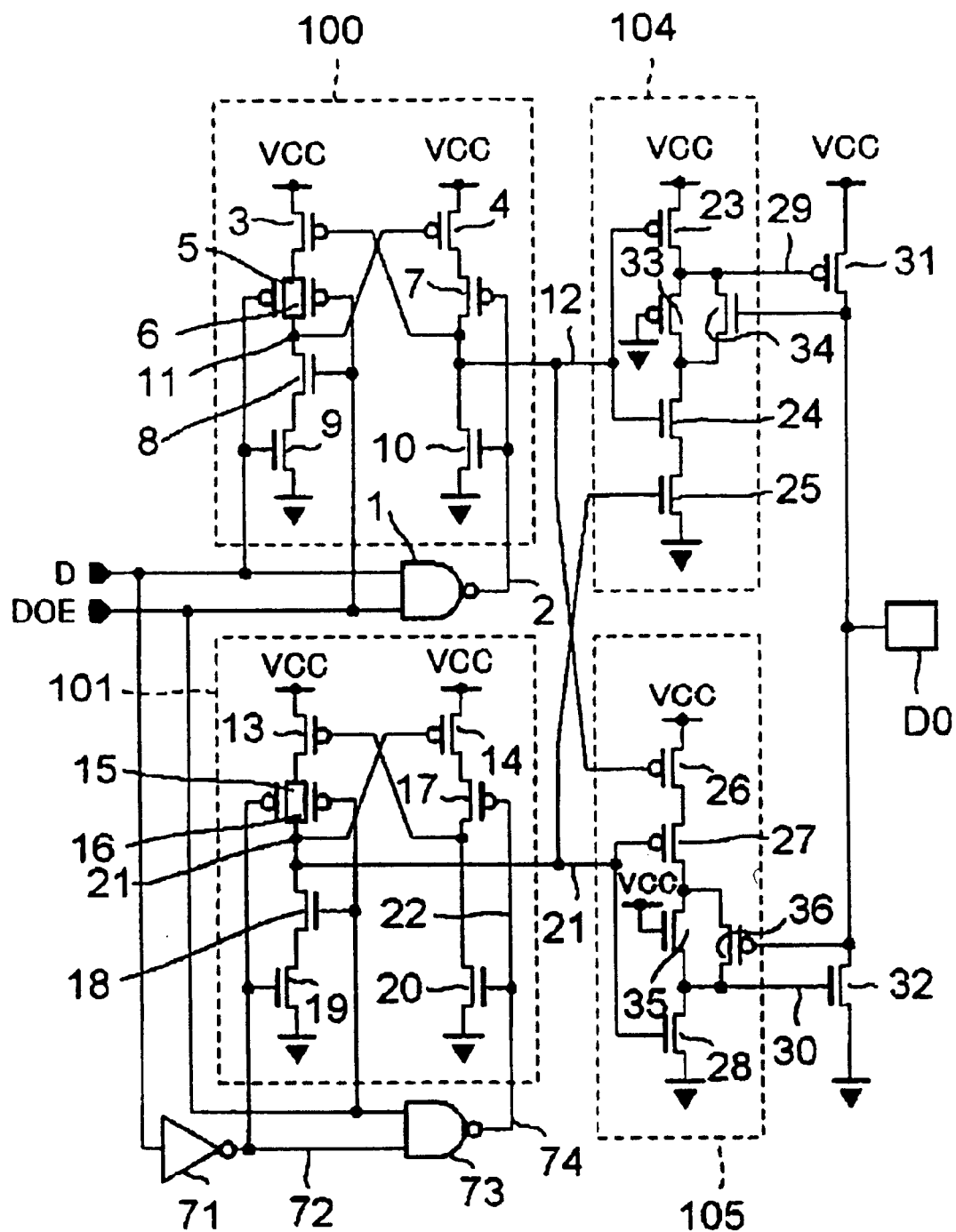
FIG. 3 is a circuit diagram of the third preferred embodiment of the present invention.

FIG. 3 is a circuit diagram showing the third preferred embodiment of the present invention. The third preferred embodiment is a modified embodiment in which the inverters 102 and 103 of the second preferred embodiment are modified. In the following, the modified portions are primarily explained. The inverter 104 includes the PMOS transistor 33 and an NMOS transistor 34 connected in parallel between the drain electrodes of the output node 29 and the NMOS transistor 24. Each gate electrode of the PMOS transistor 33 and the NMOS transistor 34 is connected to each of GND and the output terminal DO singly, in the order designated. The inverter 105 includes an NMOS transistor 35 and a PMOS transistor 36 connected in parallel between the drain electrode of the PMOS transistor 27 and the output node 30. Each gate electrode of the NMOS transistor 35 and the PMOS transistor 36 is connected to each of VCC and the output terminal DO.

In order to explain how the data output circuit works, an example is explained where the output node 12 changes to the level H from the level L when the output terminal DO and the output node 21 of the level adjustment circuit 101 are at the level L. Since the PMOS transistor 23 is in the ON state and the NMOS transistor 24 is in the OFF state when the output node 12 of the level adjustment circuit 100 is at the level L, the output node 29 and the PMOS transistor 31 of the inverter 104 are at the level H and OFF state respectively. When the output node 12 of the level adjustment circuit 100 changes to the level H, the PMOS transistor 23 changes to the OFF state and the NMOS transistor 24 changes to the ON state. Since the PMOS transistor 33 and the NMOS transistor 25 change to the ON state and the NMOS transistor 34 changes to the OFF state, the output node 29 is pulled down through the PMOS transistor 33 and NMOS transistors 24 and 25. Since the lower the electric potential level is, the higher the ON resistance value of the PMOS transistor 33 is, so the time required for change of the logic level is long. Electric discharge stops when the electric potential level approaches a threshold value of the PMOS transistor 33. Since the PMOS transistor 31 changes to the ON state and the output terminal DO changes to the level H from the level L as the electric potential level of the output node 29 decreases, the NMOS transistor 34 changes to the ON state and the output node 29 is lowered to the level L.

Furthermore, in this example, the output node 12 changes to the level H from the level L when the output terminal DO and the output node 12 of the level adjustment circuit 100 are at the level L. When the output node 12 of the level adjustment circuit 101 is at the level H, since the PMOS transistor 27 is in the OFF state and the NMOS transistor 28 is in the ON state, the output node 30 of the inverter 105 is at the level L and the NMOS transistor 32 is in the OFF state. When the output node 21 of the level adjustment circuit 101 changes to the level L, the PMOS transistor 27 changes to the ON state and the NMOS transistor 28 changes to the OFF state. Since the PMOS transistor 26 and the NMOS transistor 35 are in the ON state and the PMOS transistor 36 is in the OFF state, the output node 30 is pulled up through the PMOS transistors 26 and 27 and the NMOS transistor 35. Since the ON resistance value of the NMOS transistor 35 increases as the electric potential level increases, the time required for change of the logic level is long. Electric discharge stops when the electric potential level approaches a threshold value of the NMOS transistor 35. Since the NMOS transistor 32 changes to the ON state and the output terminal DO is lowered to the level L from the level H as the electric potential level increases, the PMOS transistor 36 changes to the ON state and the output node 30 is pulled up to the level H.

As shown in the above, according to the third embodiment, when the output terminal DO changes to the level H from the level L, since the time required for changing the logic level (at this time, changing from the level H to the level L) of the output node 29 of the inverter 104 is long, the rate of change of the current supplied by the PMOS transistor 31 is rapid. Malfunction of the device and inducing power source noise based on an inductance component being parasitic on a lead frame of a package or a bonding wire connecting the output terminal DO, VCC, and the outside terminal, may be avoided. It naturally follows that the same result is obtained when the output terminal DO changes from the level H to the level L.

The Fourth Preferred Embodiment

Figure 4:
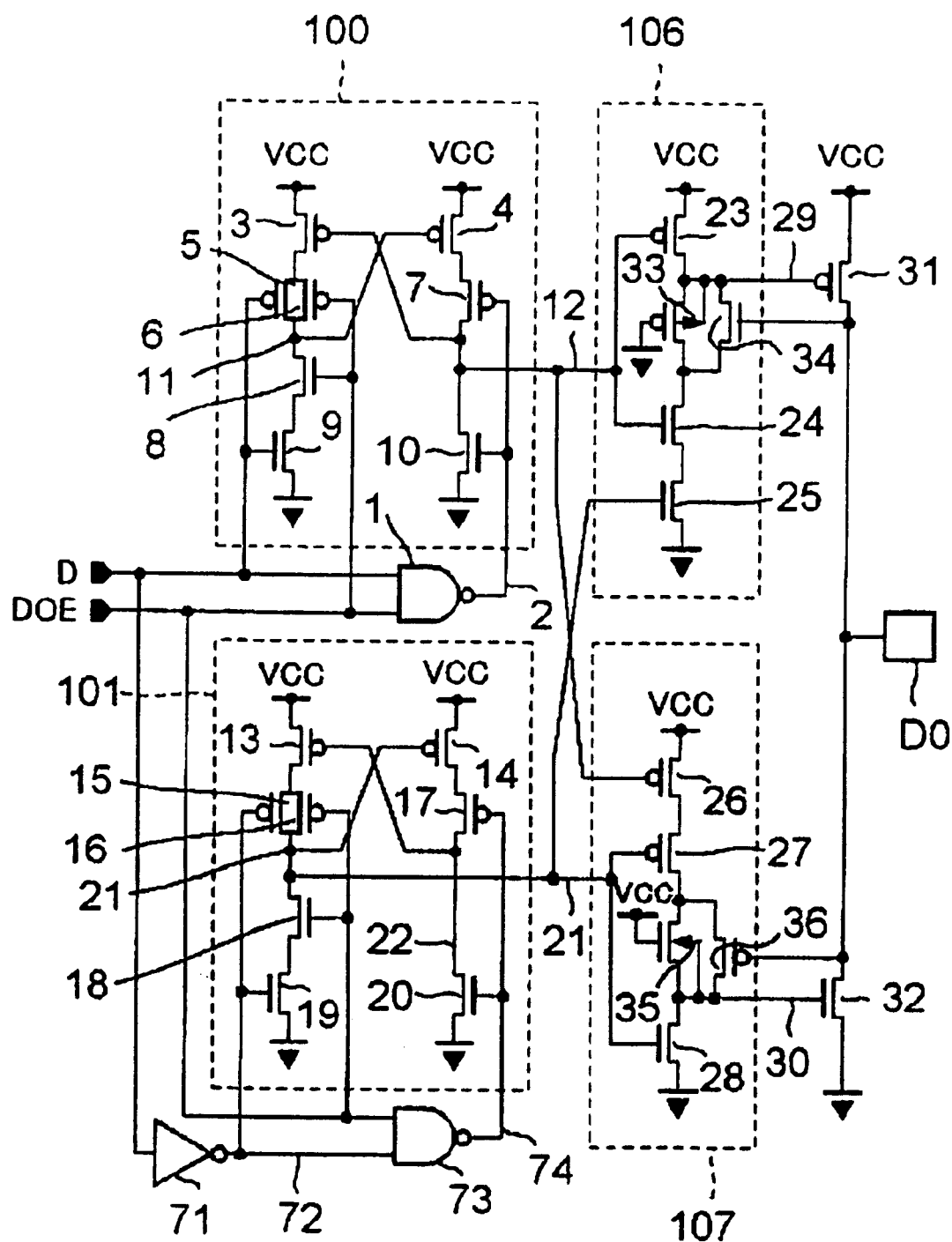
FIG. 4 is a circuit diagram of the fourth preferred embodiment of the present invention.

FIG. 4 is a circuit diagram showing the fourth preferred embodiment of the present invention. The fourth preferred embodiment is an embodiment in which elements of the inverters 106 and 107 of the third preferred embodiment are modified. In the following, modified portions are primarily explained. A source electrode of the PMOS transistor 33 of the inverter 106 is connected to a substrate. A source electrode of the NMOS transistor 35 of the inverter 107 is also connected to the substrate. Based on a substrate bias effect of both transistors of the PMOS transistor 33 and the NMOS transistor 35, the increase in threshold value is suppressed. This type of component is suitable in the case in which the data output circuit is operated using low power source voltage. To give an actual example, the power source voltage would be two to four times as high as the threshold value of the PMOS transistor 33 and the NMOS transistor 35.

As shown in the above, according to the fourth embodiment, since the threshold value based on the substrate bias effect of the PMOS transistor 33 and the NMOS transistor 35 does not increase, it is possible to increase the electric potential difference between the gate electrode and the source electrode of both transistors. As a result, the time required for changing the logic level of the output terminal DO may be shortened even if the data output circuit operates using the low power source voltage.

What is claimed is:

1. A semiconductor device including a first level shift circuit, the first level shift circuit comprising:
   a first output node;
   a first power supply node to which a first power voltage is applied;
   a second power supply node to which a second power voltage, lower than the first power voltage is applied;
   a first MOS transistor coupled between the first output node and the first power supply node, the first MOS transistor electrically connecting the first power supply node with the first output node in response to a first control signal; and a first logic circuit coupled between the first power supply node and the second power supply node, the first logic circuit for outputting the first control signal to a gate electrode of the first MOS transistor in response to an application of both a data signal and an enable signal wherein the data signal and the enable signal each have a respective logic level, the logic level of the data signal being independent of the logic level of the enable signal, the logic level of the data signal being either a first logic level or a second logic level, the logic level of the enable signal being either the first logic level or the second logic level,
   wherein irrespective of the logic level the data signal, the first level shift circuit sets the first output node in response to the first logic level of the enable signal to a predetermined electric potential that is independent of the logic level the data signal.

2. The semiconductor device according to claim 1, further comprising
   a second MOS transistor coupled between the first power supply node and the second power supply node, the first logic circuit being coupled between the second MOS transistor and the second power supply node; and
   a second logic circuit coupled between the first MOS transistor and the second power supply node, the second logic circuit controlled by a second control signal based on the data signal and the enable signal.

3. The semiconductor device according to claim 2, further comprising
   a second level shift circuit the second level shift circuit comprising a second output node;
   a third MOS transistor coupled between the second output node and the first power supply node, the third MOS transistor electrically connecting the first power supply node with the second output node in response to a third control signal
   a fourth MOS transistor coupled between the first power supply node and the second power supply node;
   a third logic circuit coupled between the fourth MOS transistor and the second power supply node, and connected to the second output node, the third logic circuit for outputting the third control signal to a gate electrode of the third MOS transistor in response to the data signal and the enable signal; and
   a fourth logic circuit coupled between the third MOS transistor and the second power supply node, the fourth logic circuit for outputting a fourth control signal to a gate electrode of the fourth MOS transistor in response to the data signal and the enable signal,
   wherein irrespective of the logic level the data signal, the second level shift circuit sets the first output node in response to the first logic level of the enable signal to a predetermined electric potential that is independent of the logic level the data signal.

4. The semiconductor device according to claim 3, further comprising
   a first inverter having a first input terminal and a first output terminal, for inverting an input signal on the first input terminal and outputting an inverted input signal to the first output terminal, wherein the first input terminal is connected to the first output node;
   a second inverter having a second input terminal and a second output terminal, for inverting an input signal on the second input terminal and outputting an inverted input signal to the second output terminal, wherein the second input terminal is connected to the second output node;
   a fifth MOS transistor connected between the first power supply node and a third output node, wherein a gate electrode of the fifth MOS transistor is connected to the first output terminal of the first inverter; and
   a sixth MOS transistor connected between the third output node and the second node, wherein a gate electrode of the second output terminal of the second inverter.

5. The semiconductor device according to claim 1, wherein the first logic circuit is comprised of a first NAND gate, and wherein the second logic circuit is comprised of a third inverter.

6. The semiconductor device according to claim 3, wherein the third logic circuit is comprised of a second NAND gate, and wherein the fourth logic circuit is comprised of a fourth inverter.

7. A semiconductor device including a first level shift circuit, the first level shift circuit comprising:
   a first output node;
   a first power supply node to which is provided a first power voltage;
   a second power supply node to which is provided a second power voltage that is lower than the first power voltage;
   a first p-channel type MOS transistor coupled between the first output node and the first power supply node, the first p-channel type transistor for pulling up an electric potential of the first output node in response to a first control signal; a second p-channel type MOS transistor coupled between the first power supply node and the second power supply node;
   a first logic circuit coupled between the second p-channel type MOS transistor and the second power supply node, the first logic circuit for outputting the first control signal to a gate electrode of the first p-channel type MOS transistor in response to both a data signal and a data output enable signal, wherein each of the data signal and the data output enable signal have either a first logic level or a second logic level; and
   a second logic circuit coupled between the first p-channel type MOS transistor and the second power supply node, the second logic circuit controlled by a second control signal based on the data signal and the data output enable signal, wherein irrespective of the logic state of the data signal, the level shift circuit holds the first output node in response to the first logic level of the enable signal at a predetermined electric potential that is independent of the logic state of the data signal.

8. The semiconductor device according to claim 7, further comprising a second level shift circuit, the second level shift circuit comprising a second output node; a third p-channel type MOS transistor coupled between the second output node and the first power supply node, the third p-channel type MOS transistor for pulling up an electric potential of the second output node in response to a third control signal;

a fourth p-channel type MOS transistor coupled between the first power supply node and the second power supply node;

a third logic circuit coupled between the second p-channel type MOS transistor and the second power supply node, and connected to the second output node, the third logic circuit for outputting the third control signal to a gate electrode of the third p-channel type MOS transistor in response to the data signal and the data output enable signal; and a fourth logic circuit coupled between the fourth p-channel type MOS transistor and the second power supply node, the fourth logic circuit controlled by a fourth control signal based on the data signal and the data output enable signal, wherein irrespective of the logic state the data signal, the second level shift circuit holds the second output node in response to the logic state of the data output enable signal at a predetermined electric potential that is independent of the logic state the data signal.

9. The semiconductor device according to claim 8, further comprising:

a first inverter having a first input terminal and a first output terminal, for inverting an input signal on the first input terminal and outputting an inverted input signal to the first output terminal, wherein the first input terminal is connected to the first output node;

a second inverter having a second input terminal and a second output terminal, for inverting an input signal on the second input terminal and outputting an inverted input signal to the second output terminal, wherein the second input terminal is connected to the second output node;

a fifth p-channel transistor connected between the first power supply node and a third output node, wherein a gate electrode of the fifth p-channel transistor is connected to the first output terminal of the first inverter; and a first n-channel MOS transistor connected between the third output node and the second node, wherein a gate electrode of the second output terminal of the second inverter.

10. The semiconductor device according to claim 9, wherein the third logic circuit is comprised of a second NAND gate, and wherein the fourth logic circuit is comprised of a fourth inverter.

11. The semiconductor device according to claim 8, wherein the first logic circuit is comprised of a first NAND gate, and wherein the second logic circuit is comprised of a third inverter.

12. A semiconductor device including a first level shift circuit, the first level shift circuit comprising:

an output node;

a first power supply node to which is provided a first power voltage;

a second power supply node to which is provided a second power voltage that is lower than the first power voltage;

cross-coupled first and second p channel transistors, each having a respective path of controllable conductivity and a control electrode, wherein the first and second p channel transistors are coupled between the first power supply node and the second power supply node; and a first logic circuit coupled between the first and second p channel transistors and the second power supply node, the first logic circuit connected to the control electrodes of the first and second p channel transistors, for causing either the first or second p channel transistors to be conductive and causing the other transistor to be turned off in response to both a data signal and an enable signal, wherein each of the data signal and the enable signal has a logic level being either a first logic level or a second logic level, wherein independently of the logic level the enable signal the data signal has either a first logic level or a second logic level, wherein irrespective of the logic state of the data signal, the first level shift circuit sets the first output node in response to the first logic state of the enable signal at a predetermined potential that is independent of the logic state of the data signal.

13. The semiconductor device according to claim 12, further comprising a second level shift circuit, the second level shift circuit including cross-coupled third and fourth p channel transistors, each having a respective path of controllable conductivity and a control electrode, wherein the third and fourth p channel transistors are coupled between the first power supply node and the second power supply node; and a second logic circuit coupled between the third and fourth p channel transistors and the second power supply node, the second logic circuit connected to the control electrodes of the third and fourth p channel transistors, for causing one of the third or fourth p channel transistors to be conductive and for causing one of the third or fourth p channel transistors to be conductive and causing the other transistor to be turned off, in response to the data signal and the enable signal;

wherein irrespective of the logic level of the data signal, the second level shift circuit holds the second output node in response to the first logic level of the enable signal at a predetermined potential that is independent of the logic level of the data signal.

14. The semiconductor device according to claim 13, further comprising a first inverter having a first input terminal and a first output terminal, for inverting an input signal on the first input terminal and outputting an inverted input signal to the first output terminal, wherein the first input terminal is connected to the first output node;

a second inverter having a second input terminal and a second output terminal, for inverting an input signal on the second input terminal and outputting an inverted input signal to the second output terminal, wherein the second input terminal is connected to the second output node;

a fifth p-channel transistor connected between the first power supply node and a third output node, wherein a gate electrode of the fifth p-channel transistor is connected to the first output terminal of the first inverter; and a first n-channel MOS transistor connected between the third output node and the second node, wherein a gate electrode of the second output terminal of the second inverter.

15. The semiconductor device according to claim 13, wherein the first logic circuit and the second logic circuit are respectively comprised of NAND gates and complementary MOS inverters.

16. A semiconductor device including a level shift circuit, the level shift circuit comprising:

an output node;

a first node to which a first voltage is provided;

a second node to which a second voltage is provided, wherein the second power voltage is lower than the first power voltage;

a first p-channel type MOS transistor coupled between the output node and the first node, the first p-channel type transistor for pulling up an electric potential of the output node in response to a first control signal;

a second p-channel type MOS transistor coupled to the first node;

a NAND gate coupled between the second p-channel type MOS transistor and the second node, the NAND gate for outputting the first control signal to a gate electrode of the first p-channel type MOS transistor in response to both a data signal and an enable signal, wherein the data signal and the enable signal respectively have either a first logic level or a second logic level, wherein a logic state of the data signal changes to either the first logic level or the second logic level irrespective of the logic level of the enable signal;

an inverter coupled between the first p-channel type MOS transistor and the second power supply node, the inverter having an input terminal and an output terminal, for outputting a second control signal to a gate electrode of the second p-channel type MOS transistor, wherein the output terminal of the inverter is connected to the output node; and a logic gate which receives the data signal and the enable signal and outputs a third control signal to the input terminal of the inverter, wherein irrespective of the logic state of the data signal, the level shift circuit holds the output node in response to the first logic level of the data output enable signal at a predetermined electric potential that is independent of the logic state of the data signal.

17. A semiconductor device comprising a second level shift circuit, the second level shift circuit comprising a second output node; a first power supply node to which a first power voltage is provided;

a second node to which a second voltage is provided, wherein the second power voltage is lower than the first power voltage;

a third MOS transistor coupled between the second output node and the first power supply node, the third MOS transistor electrically connecting the first power supply node with the second output node in response to a third control signal;

a fourth MOS transistor coupled between the first power supply node and the second power supply node;

a third logic circuit coupled between the fourth MOS transistor and the second power supply node and connected to the second output node, the third logic circuit for outputting the third control signal to a gate electrode of the third MOS transistor in response to both a data signal and an enable signal, wherein the data signal and the enable signal respectively have either a first logic level or a second logic level, and wherein the data signal has the first or the second logic level irrespective of the logic level of the enable signal; and a fourth logic circuit coupled between the third MOS transistor and the second power supply node, the fourth logic circuit for outputting a fourth control signal to a gate electrode of the fourth MOS transistor in response to the data signal and the enable signal, wherein irrespective of the logic state the data signal, the second level shift circuit sets the second output node to a fixed electric potential in response to the first logic level of the enable signal.

18. The semiconductor device according to claim 17, further comprising a first level shift circuit, the first level shift circuit comprising:

a first output node;

a first MOS transistor coupled between the first output node and the first power supply node, the first MOS transistor electrically connecting the first power supply node with the first output node in response to a first control signal; and a first logic circuit coupled between the first power supply node and the second power supply node, the first logic circuit for outputting the first control signal to a gate electrode of the first MOS transistor in response to the data signal and the enable signal, wherein irrespective of the logic level the data signal, the first level shift circuit sets the first output node in response to the first logic level of the enable signal to a predetermined electric potential that is independent of the logic level the data signal.

19. The semiconductor device according to claim 18, further comprising a second MOS transistor coupled between the first power supply node and the second power supply node;

the first logic circuit coupled between the second MOS transistor and the second power supply node; and a second logic circuit coupled between the first MOS transistor and the second power supply node, the second logic circuit controlled by a second control signal based on the data signal and the enable signal.

20. The semiconductor device according to claim 19, further comprising a first inverter having a first input terminal and a first output terminal, for inverting an input signal on the first input terminal and outputting an inverted input signal to the first output terminal, wherein the first input terminal is connected to the first output node;

a second inverter having a second input terminal and a second output terminal, for inverting an input signal on the second input terminal and outputting an inverted input signal to the second output terminal, wherein the second input terminal is connected to the second output node;

a fifth MOS transistor connected between the first power supply node and a third output node, wherein a gate electrode of the fifth MOS transistor is connected to the first output terminal of the first inverter; and a sixth MOS transistor connected between the third output node and the second node, wherein a gate electrode of the second output terminal of the second inverter.

* * * * *